United States Patent
Allison et al.

(10) Patent No.: US 9,176,973 B1
(45) Date of Patent: Nov. 3, 2015

(54) RECURSIVE-CAPABLE LOSSLESS COMPRESSION MECHANISM

(71) Applicant: Timmes, Inc., St. Petersburg, FL (US)

(72) Inventors: Phillip Allison, St. Petersburg, FL (US); Stelian Doru Ticsa, Clearwater, FL (US)

(73) Assignee: TIMMES, INC., St. Petersburg, FL (US)

( * ) Notice: Subject to any disclaimer, the term of this patent is extended or adjusted under 35 U.S.C. 154(b) by 280 days.

(21) Appl. No.: 13/918,350

(22) Filed: Jun. 14, 2013

(51) Int. Cl.
   *G06F 17/30* (2006.01)
(52) U.S. Cl.
   CPC ............ *G06F 17/30129* (2013.01)
(58) Field of Classification Search
   None
   See application file for complete search history.

(56) References Cited

U.S. PATENT DOCUMENTS

| | | | |
|---|---|---|---|
| 4,558,302 A | 12/1985 | Welch | |
| 5,406,279 A * | 4/1995 | Anderson et al. | 341/51 |
| 5,488,364 A | 1/1996 | Cole | |
| 7,065,603 B2 * | 6/2006 | Smith et al. | 710/305 |
| 7,171,053 B2 * | 1/2007 | Van der Vleuten | H03M 7/3066 382/232 |
| 2007/0274320 A1 * | 11/2007 | Joshi et al. | 370/395.2 |
| 2012/0221325 A1 | 8/2012 | Choo et al. | |
| 2014/0067820 A1 * | 3/2014 | Wilkins et al. | 707/741 |

* cited by examiner

*Primary Examiner* — Belix M Ortiz Ditren
(74) *Attorney, Agent, or Firm* — Andriy Lytvyn; Smith & Hopen, P.A.

(57) ABSTRACT

Computer-executed method for losslessly compressing and decompressing electronic media data. The method is executed in four phases. During the initial phase, the most significant bits are removed. During the second phase, data segments capable of occupying less space are replaced with a nominator of a fixed field of denominators, and the resultant data is hashed. In the third phase, the hashed data is compressed using an entropy reduction technique. In the fourth phase, the compressed data is stored using an arithmetic coding. Multiple passes may be performed, therefore increasing the compression ratio.

5 Claims, 4 Drawing Sheets

Recursive Capable Lossless Compression Test
TEST RESULTS dtd. February 12, 2013

| FILE TYPE | ORIGINAL FILE SIZE (KB) | FIRST PASS | | SECOND PASS | | THIRD PASS | | SPACE SAVINGS | MD5 RESULTS |
| --- | --- | --- | --- | --- | --- | --- | --- | --- | --- |
| | | FILE SIZE (KB) | COMPRESSION RATIO | FILE SIZE (KB) | COMPRESSION RATIO | FILE SIZE (KB) | COMPRESSION RATIO | | |
| J2K | 63.0 | 54.0 | 1.17 | 47.0 | 1.34 | 39.5 | 1.59 | 37% | PASS |
| J2K | 31.0 | 27.0 | 1.15 | 23.0 | 1.35 | N/A | N/A | 26% | PASS |

\* Compression Ratio = Uncompressed File Size / Compressed File Size
\* Space Savings = 1 − Compressed File Size / Uncompressed File Size (percentage)

*FIG. 4*

RECURSIVE-CAPABLE LOSSLESS COMPRESSION MECHANISM

BACKGROUND OF THE INVENTION

1. Field of the Invention

This invention relates to compression of electronic data. More specifically, it relates to recursive-capable lossless compression of highly random electronic data.

2. Description of the Prior Art

Compression of electronic data is essential to normal functionality of modern information technologies. As the amount of digital data and the sizes of computer files increase at an unprecedented rate, the need for efficient compression of electronic data is more pressing than ever. Current compression technologies, however, are limited in their capabilities.

Most compression algorithms focus on removing entropy—repeated or similar data fragments—from the original data. Numerous compression technologies based on this scheme are widely known and used in the art. They include the use of dictionaries, tables of previously encountered data, and partial matches of previous data. Hashes of the previous data have been used to improve efficacy of compression technologies, and multithreaded engines have been used to decrease the time required to compress the datasets. However, to date, little has been done to approach compression of electronic data that is highly random and has little to no entropy, such as JPEG2000 and NITF files.

Technologies for compression of electronic data may be divided in two broad categories: lossy and lossless. Lossy compression inevitably introduces a degree of degradation to the original data—meaning that an exact replica of the original data cannot be recovered after the original data is compressed. Although lossy compression can be quite beneficial for some uses, degradation of original data is a major drawback that renders lossy compression ineffective for many applications.

Lossless compression, on the other hand, permits the original electronic data to be compressed and decompressed without any degradation. A number of lossless compression algorithms are known in the art. Most rely on run-length encoding, or a modified version thereof, to exploit redundancy in the electronic data. During compression, the blocks of data having a particular value are substituted with a smaller number of key bytes, thus reducing the size of the data. The key bytes contain both the value of the byte and the number of bytes in the run. The key bytes dictate the number of times the data byte value must be expanded or duplicated to obtain the original data from the compressed data. An example of lossless compression method implementing this technique is the Lempel-Ziv-Welch method patented in U.S. Pat. No. 4,558,302.

The lossless compression methods known in art have some significant limitations. Although they can be quite effective for compressing data with a high amount of entropy, such as text files and word-processor documents, they are ineffective and often counterproductive for compression of highly random data, such as JPEG2000 and NITF. Moreover, even for electronic data with high entropy, once the entropy is reduced after lossless compression, currently available methods cannot compress such data any further.

Accordingly, what is needed is a method of lossless compression of electronic data capable of recursive compression.

SUMMARY OF THE INVENTION

It is an objective of the invention to reduce the size of digital data files. Instead of using entropy reduction techniques, the present invention manipulates the electronic data facilitating lossless compression thereof.

In an embodiment, the method of lossless compression is performed by a computing device, which losslessly modifies the media data into a compressible state. The computing device accesses the media data as a collection of numbers. The most significant bit is cleared from the media data and stored in the index file. The computing device identifies segments of the media data capable of requiring less storage space if expressed as a numerator of a fixed filed of denominators. These segments are replaced with the numerator, and the resultant data is hashed. The collision count is stored in the recovery file. The hash is compressed using an entropy reduction technique and is stored using arithmetic coding to remove remaining entropy.

In an embodiment, the index file, the recovery file, and the hash are concatenated into a single file. A pass value integer may be denoted within a header of the file.

In an embodiment, the arithmetic coding is adaptive.

A 64-bit representation of an original length of the media data may also be stored within the header of the index file.

The original media data may be losslessly recovered from the compressed state. The decompression method involves accessing the compressed state of the original media data as a collection of numbers. The length of the original media data, the collision count, the removed most significant bits, and the hash are received by the computing device. A segment of the original media data is retrieved from a rainbow table based on the collision count and the hash, and is subsequently restored to its original location within the collection of numbers. The most significant bits are also restored. The above steps are repeated for a number of passes corresponding to the number of passes performed during the compression stage.

The integrity of decompressed media data may be verified using a MD5, a SHA-1, or another data verification algorithm.

BRIEF DESCRIPTION OF THE DRAWINGS

For a fuller understanding of the invention, reference should be made to the following detailed description, taken in connection with the accompanying drawings, in which:

FIG. 4 is a table listing the test results of the compression and decompression methods.

DETAILED DESCRIPTION OF THE PREFERRED EMBODIMENT

In the following detailed description of the preferred embodiments, reference is made to the accompanying drawings, which form a part hereof, and within which are shown by way of illustration specific embodiments by which the invention may be practiced. It is to be understood that other embodiments having structural changes may be made without departing from the scope of the invention.

The present invention is based on the fact that all electronic data is simply numbers, and all electronic data may be expressed as numerical strings. These strings may be stored, transferred, processed, and otherwise manipulated. A non-transitory computer medium contains a set of instructions that allow a computing device to process and interpret the numerical data for its intended purpose.

The invention provides a methodology of reducing the amount of data that must be sent or retrieved without introducing any losses or degradation to the original data. This objective is accomplished by performing a hash for a portion of the data to be removed during the sending or storing stage. The original data can later be recovered by finding the data that matches this hash. This method allows a selected portion of the data to be represented by a much smaller numerical string that is a key to the actual sent data—when combined with the data that is left undisturbed, the key can be used to recreate the original number that represents the data that was stored or sent.

Figure 1:
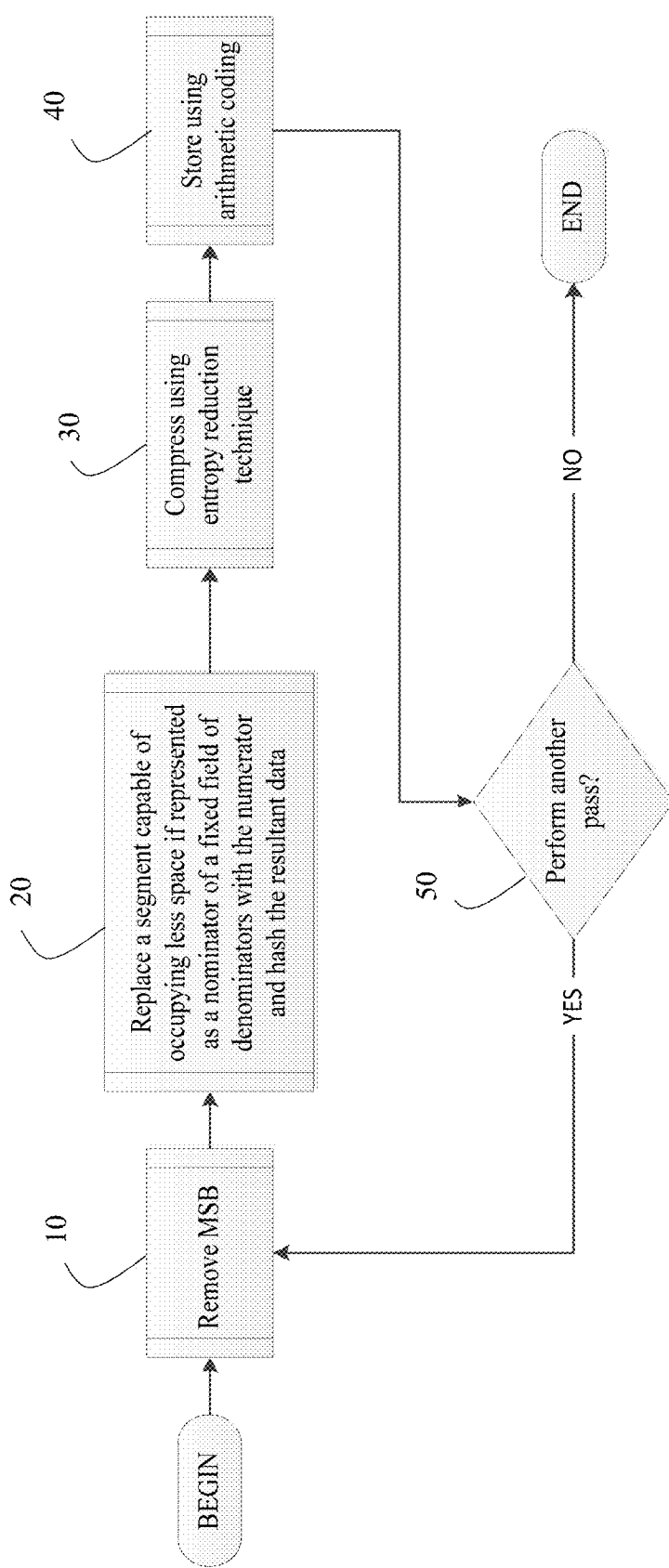
FIG. 1 is a flowchart depicting the four general phases of the compression method.

As shown in FIG. 1, the method according to the present invention may be subdivided into four discrete phases. In phase 10, the most significant bits (MSBs) are removed. In phase 20, data segments capable of occupying less space if represented as a nominator of a fixed field of denominators are replaced with the numerators and the resultant data is hashed. The hashed data is compressed using an entropy reduction technique during phase 30. The compressed data is stored using an arithmetic coding in phase 40.

Figure 2:
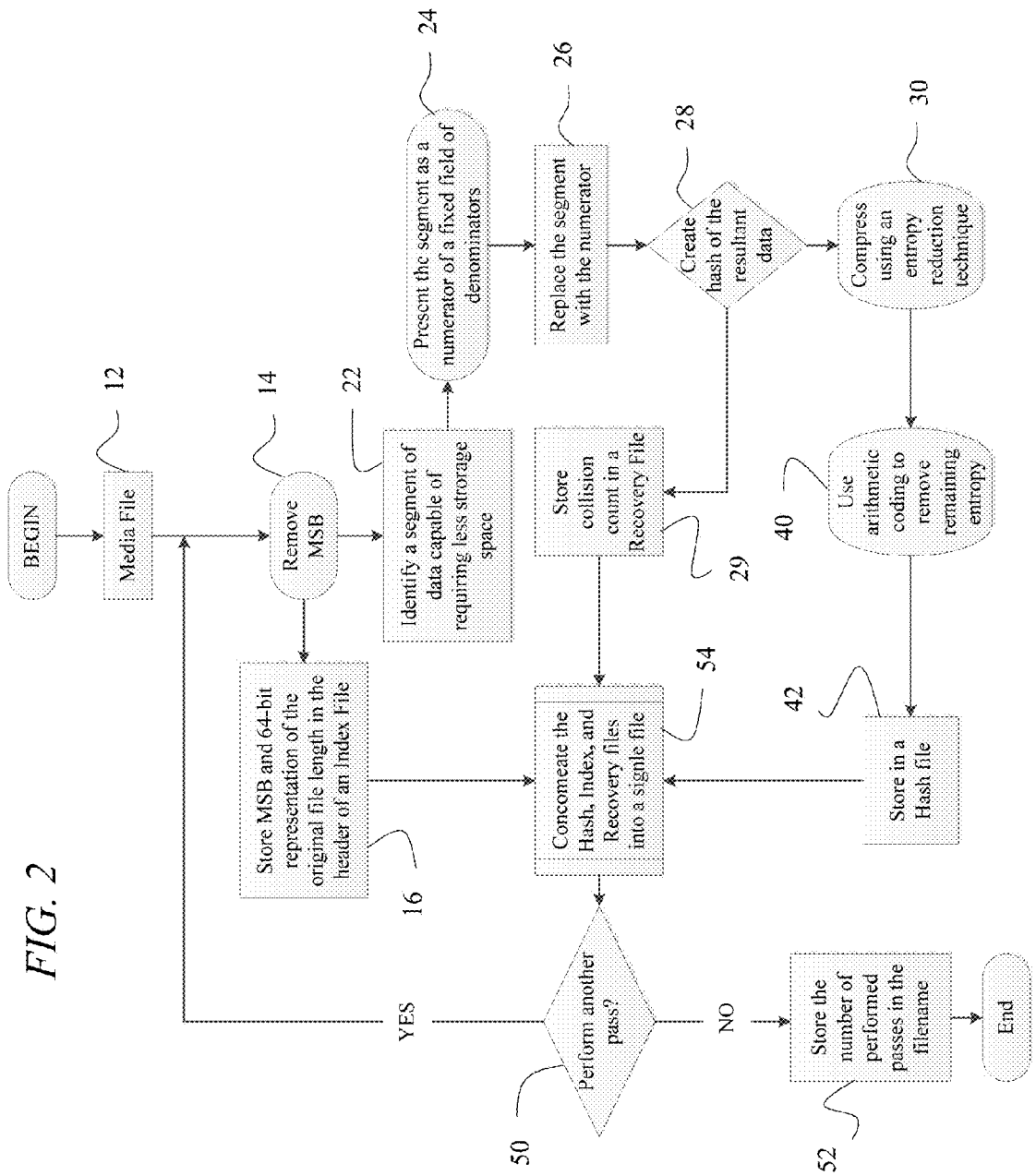
FIG. 2 is a flowchart depicting individual steps of the compression method.

FIG. 2 provides a more detailed schematic representation of the present invention. During the initial phase 10, an electronic media file is provided in step 12. In step 14, the MSB is removed from the electronic data to eliminate signing, whether negative or positive. The cleared MSBs are stored in the index file in step 16, during which a 64-bit representation of the length of the original uncompressed numerical string is also stored at in the header of the index file. Removal of MSBs dramatically reduces the number of possible collisions, which constitute unmatched data for the same hash signature. Probability of collisions increases with data size, and therefore, for large data files this step leads to significant size reduction.

During phase 20, the data (i.e. the numerical string) is checked for data segments that would consume less space if presented as the numerator of a fixed field of denominators in steps 22 and 24. The segment is then replaced by the numerator in step 26, and only the numerator is stored in the position previously occupied by the replaced segment, thus reducing the size of the data. On subsequent passes, different fixed fields of denominators are chosen to allow for further compression of the data, including the areas already compressed in previous passes. In step 28, a hash is used to represent the resulting data. The collision count for the hash is stored in the recovery file in step 29, which is essentially a digital map representing the locations of the removed data segments within the original numerical string.

During phase 30, the hash is compressed using common entropy reduction techniques, such as the ones based on run-length encoding.

During phase 40, the output from the previous phases is stored using arithmetic coding to remove any remaining entropy caused by the need to store the data internally with larger data cast types than the actual data—adaptive arithmetic coding is preferred. The resultant hash is stored in the hash file in step 42.

The output of the compression method described above comprises three files: index, recovery, and hash. The index file contains cleared MSBs, the recovery file contains the collision count, and the hashes of the data are stored in the hash file. These three files may be concatenated into a single resultant file in step 54. If in step 50, it is determined that a subsequent pass is necessary, the above steps are repeated. Multiple subsequent passes may be performed leading to further lossless compression. The number of performed passes and the type of arithmetic coding used are denoted within the header of the hash file in step 52.

To recover the original data, the same number of passes must be performed at the decompression stage as were performed during the compression stage.

Figure 3:
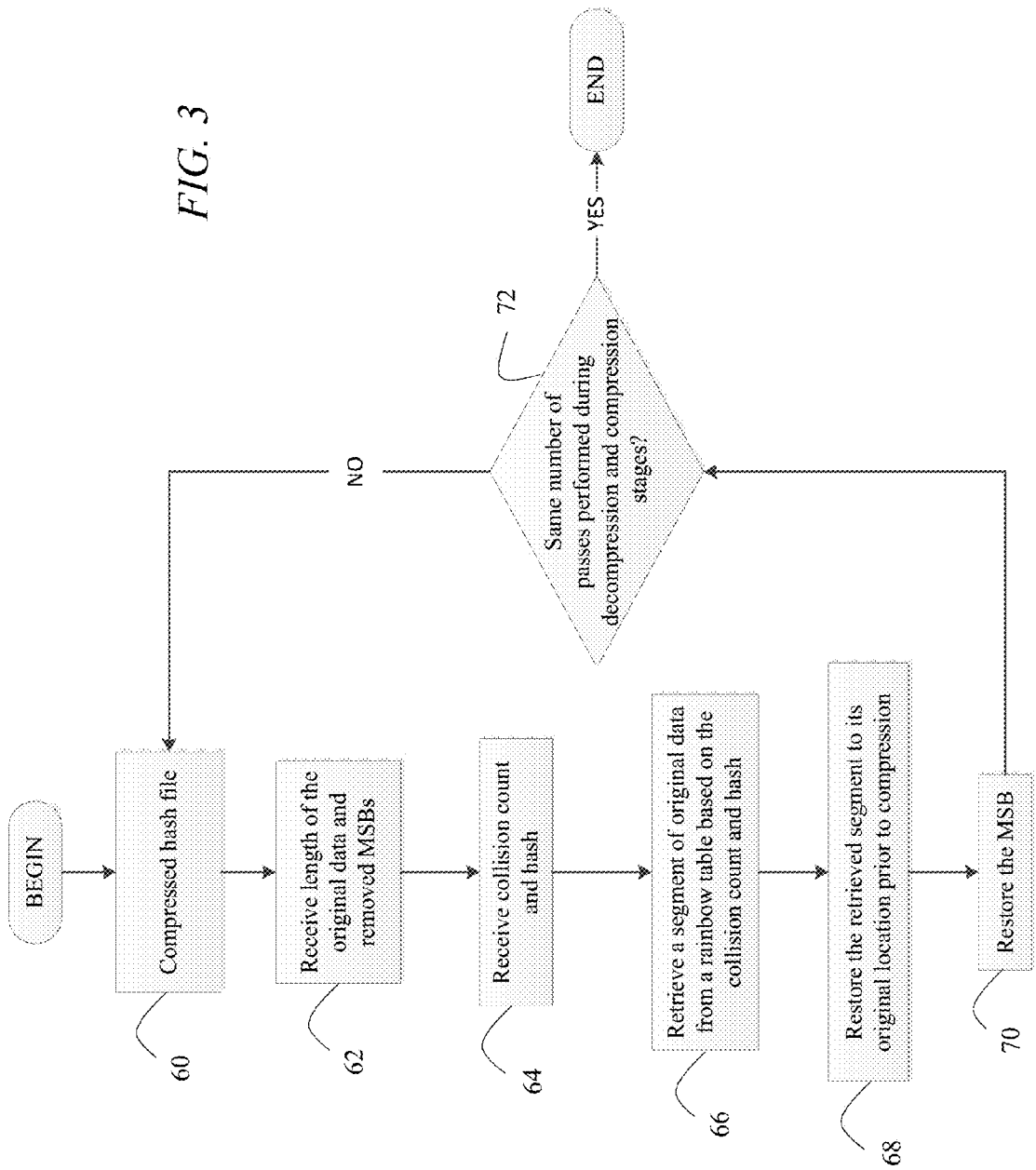
FIG. 3 is a flowchart depicting the steps of the decompression method.

Referring to FIG. 3, recovery of the original data involves receiving the compressed hash file in step 60. The length of the original data and the removed MSBs stored in the Index file are received in step 62. The collision count is received in step 64. Recovery of the original data involves using pre-computed tables—such as rainbow tables—for reversing hash functions. In one embodiment of the invention the rainbow table is a three-dimensional array. In step 66, the original data is retrieved from the rainbow table based on the hash of the data and the corresponding collision count. After the decompressed data is recovered, it is restored to its original location in step 68. The original MSBs, which were cleared during the compression stage, are retrieved from the index file and are restored to their original location within the collection of numbers in step 70. In step 72, the number of passes performed during decompression stage is compared to the number of passes performed during the compression stage: if the number of decompression passes is less than the number of compression passes, then steps 60 through 70 are repeated again. The integrity of the decompressed data may be verified using any one of the data verification algorithms known in the art, including MD5 and SHA-1.

To reduce the size of the data without using repeated or partially matched data in a manner that allows reversal of the process, a close $n^{th}$ root modulus is approximated. The invention uses hash function for recovery of the loss of data caused by reduction to the $n^{th}$ root, thus allowing for lossless compression and recovery. The true numerator is factorized, and a hash of the original data is compared to the tested factor. Collisions of the hash function are mitigated by a saved bit count of the original data and are used as a secondary verification stage. A third verification is the storage of the results of a primality test during and the final primality test of the returned data and a comparison of the results.

The above tests allow a collision probability of 0 of all verification methods, increasing the probability of correctly factored data during decompression to 100%. By using this factoring, a time/space trade-off is created, allowing for the reduction of original data size.

Testing

The recursive lossless compression technique according to the present invention has been successfully tested and the outcome has confirmed compression of highly random data (JPEG2000 files) as shown in the table of FIG. 4. The metrics used to measure compression performance and data integrity were as follows:

Compression Ratio=uncompressed file size/compressed file size.

Space Savings=1−compressed file size/uncompressed file size (%).

MD5—The MD5 Message-Digest Algorithm is a commonly used tool to check data integrity.

Test Procedures

One laptop with Linux O/S was used as the compression platform.

The computer program embodying the present invention was Linux O/S based and installed in the laptop.

Two JPEG2000 files, 63 KB and 31 KB, were provided for the compression tests.

The 63 KB file was tested first and three passes of compression were performed. Following compression and decompression, the MD5 test was performed to verify that the original data was restored without any losses.

The 31 KB file was tested second and two passes of compression were performed. Following compression and decompression, the MD5 test was performed to verify that the original data was restored without any losses.

Results of the two file test were summarized in a performance table.

Test Observations

The performance of the recursive lossless compression algorithm has been tested and the observations are outline below. This algorithm carries out the lossless compression of the data file in multiple passes. Each pass consists of several phases: first phase generates a hash file and the second phase carries out the arithmetic coding on the hash file to generate the compressed file. This compressed file is used as the input to the next pass of compression. A file can be compressed in multiple passes, each pass progressively reducing the files size as shown in FIG. 4 (only three passes were performed, although more passes are possible).

The decoding operation for each pass also consists of multiple phases, including the arithmetic decoding followed by the decoding according to the novel decompression method described above. A file compressed using three passes requires three decoding passes, each consisting of multiple phases.

The performance of this codec for two JPEG2000 (J2K) compressed files, 63 KB and 31 KB respectively. The 63 KB file was compressed and decompressed using three passes and the 31 KB file was compressed and decompressed using two passes. The results are shown below in FIG. 4.

Following the compression testing, an MD5 data integrity test was performed and passed successfully.

Test Findings

The lossless compression algorithm according to the invention successfully completed the lossless compression of JPEG2000 files. As shown in FIG. 4, there is a continued reduction in file size over multiple passes with the compression ratio improving from 1.17 (first pass) to 1.59 (third pass).

The lossless compression algorithm according to the invention offers a lossless compression engine for already compressed files that provides improved Data Storage space savings of 37% (after third pass on first image file).

The lossless compression algorithm according to the invention successfully passed the MD5 data integrity test following the compression and decompression of JPEG2000 files.

Hardware and Software Infrastructure Examples

The present invention may be embodied on various computing platforms that perform actions responsive to software-based instructions. The following provides an antecedent basis for the information technology that may be utilized to enable the invention.

The computer readable medium described in the claims below may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire-line, optical fiber cable, radio frequency, etc., or any suitable combination of the foregoing. Computer program code for carrying out operations for aspects of the present invention may be written in any combination of one or more programming languages, including an object oriented programming language such as Java, C#, C++ or the like and conventional procedural programming languages, such as the "C" programming language or similar programming languages.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

Glossary of the Claim Terms

Arithmetic coding—a form of entropy encoding used in lossless data compression, wherein a string of characters is represented using a fixed number of bits per character and the frequently used characters are be stored with fewer bits than the seldom occurring characters, thus reducing the total number of bits.

Collision count—segments of numbers matching a hash.

Compressed state—a representation of a media data requiring less storage space than the original data.

Computing device—a device having a central processing unit programmable to execute arithmetic or logical operations.

Entropy—redundant segments of numbers within the total collection of numbers.

Entropy reduction technique—substituting larger redundant segments of numbers with smaller segments of numbers.

Hashing—mapping data sets of variable length to data sets of a fixed length

Hash file—an electronic file storing the data sets of fixed length produced by hashing.

Header—supplemental data placed at the beginning of a block of data being stored or transmitted.

Index file—an electronic file storing most significant bits and original length of the collection of numbers representing media data.

Lossless—without degradation or loss of data.

MD5—a hash function that produces a 128-bit hash value used to verify data integrity.

Media data—electronic information available to a computer program and capable of being stored.

Most significant bit—the bit position in a binary number having the greatest value.

Pass value integer—a integer representing the total number that a set of steps has been performed.

Rainbow table—a pre-computed table used for reversing hash functions.

Recovery file—an electronic file in which a collision count is stored.

Segment—a subset of numbers within a larger collection of numbers.

SHA-1—a hash function that produces a 160-bit hash value used to verify data integrity Storage space—amount of digital information storage units (bytes) required to store media data.

What is claimed is:

1. A method performed by a computing device for losslessly modifying media data into a compressible state, the method comprising:
   accessing the media data as a collection of numbers;
   clearing a most significant bit from the media data;
   storing the most significant bit in an index file;
   identifying a first segment of the media data that would re require less storage space when expressed as a numerator of a fixed field of denominators;
   replacing the first segment of the media data with the numerator;
   storing a collision count for the media data in a recovery file;
   creating a hash of the media data;
   compressing the hash using an entropy reduction technique; and
   storing the hash file using arithmetic coding.

2. The method of claim 1, further comprising concatenating the index file, the recovery file, and the hash file into a single file.

3. The method of claim 1, further comprising denoting a pass value integer within a file header.

4. The method of claim 1, wherein the arithmetic coding is adaptive.

5. The method of claim 1, wherein a 64-bit representation of an original length of media data is stored in a header of the index file.

* * * * *